United States Patent
Onose et al.

(10) Patent No.: US 7,256,453 B2
(45) Date of Patent: Aug. 14, 2007

(54) SEMICONDUCTOR DEVICE

(75) Inventors: Hidekatsu Onose, Hitachi (JP); Atsuo Watanabe, Hitachiota (JP)

(73) Assignee: Hitachi, Ltd., Tokyo (JP)

( * ) Notice: Subject to any disclaimer, the term of this patent is extended or adjusted under 35 U.S.C. 154(b) by 87 days.

(21) Appl. No.: 11/038,929

(22) Filed: Jan. 18, 2005

(65) Prior Publication Data
US 2005/0121717 A1 Jun. 9, 2005

Related U.S. Application Data

(62) Division of application No. 10/640,411, filed on Aug. 13, 2003, now Pat. No. 6,894,346.

(30) Foreign Application Priority Data
Dec. 18, 2002 (JP) .............................. 2002-366886

(51) Int. Cl.
*H01L 29/76* (2006.01)
*H01L 29/94* (2006.01)
(52) U.S. Cl. ...................... 257/329; 257/401
(58) Field of Classification Search ........ 257/327–329, 257/288, 401, E29.076
See application file for complete search history.

(56) References Cited

U.S. PATENT DOCUMENTS

| 5,031,009 | A | 7/1991 | Fujihira | |
| 5,079,607 | A | 1/1992 | Sakurai | 257/394 |
| 5,309,007 | A | 5/1994 | Kelner et al. | |
| 6,281,521 | B1 | 8/2001 | Singh | 257/77 |
| 6,313,488 | B1 * | 11/2001 | Bakowski et al. | 257/198 |
| 6,486,011 | B1 | 11/2002 | Yu | |

FOREIGN PATENT DOCUMENTS

| DE | 196 44 821 | 10/1996 |
| EP | 1 248 302 | 10/2002 |
| EP | 1 306 903 | 5/2003 |

OTHER PUBLICATIONS

S. Harada et al., "Back-Gate 4H-SiC JFET Fabricated on N-Type Substrate", The Japan Society of Applied Physics, The 61st Autumn Meeting, 2000.

* cited by examiner

Primary Examiner—Theresa T. Doan
(74) Attorney, Agent, or Firm—Hogan & Hartson LLP

(57) ABSTRACT

A structure is provided that ensures a low on-resistance and a better blocking effect. In a lateral type SIT (Static Induction Transistor) in which a first region is used as a $p^+$ gate and a gate electrode is formed on the bottom of the first region, the structure is built such that the $p^+$ gate and an $n^+$ source are contiguous. An insulating film is formed on the surface of an $n^-$ channel, and an auxiliary gate electrode is formed on the insulating film. In addition, the auxiliary gate electrode and the source electrode are shorted.

3 Claims, 8 Drawing Sheets

SEMICONDUCTOR DEVICE

This is a divisional of application Ser. No. 10/640,411, filed Aug. 13, 2003, now U.S. Pat. No. 6,894,346, which application is hereby incorporated by reference in its entirety.

BACKGROUND OF THE INVENTION

The present invention relates to an improved structure of a lateral channel type junction type FET (JFET) or a static induction transistor (SIT).

Silicon carbide (SiC), which has a dielectric breakdown field about 10 times as large as that of silicon (Si), is a material that reduces the loss because it can reduce the thickness, and increase the density, of the drift layer that withstands the voltage. Power semiconductor devices using SiC include a junction type FET (JFET) and a static induction transistor (SIT). An example of an SIT that utilizes the characteristics of SiC is the structure described in "Back-gate 4H-SiC JFET fabricated on n-type substrate" in Extended Abstracts for the 61st Autumn Meeting, 2000, The Japan Society of Applied Physics (September, 2000, Hokkaido Institute of Technology).

The structure described in that publication is that the $p^+$ layer, which is the gate region, is formed on the n-type substrate, the $n^-$ drift layer is formed above that layer and, across the channel, the $n^+$ drain region and the $n^+$ source region are formed. The gate electrode is formed on the major surface of the n-type substrate, the drain electrode in the drain region, and the source electrode in the source region. An SIT is a transistor that turns on or off the current by the depletion layer extending from the gate to the channel. This transistor produces a normally off state by reducing the thickness of the $n^-$ layer even when the gate voltage is 0V.

SUMMARY OF THE INVENTION

In the conventional structure described above, the channel is a thin region between the $n^+$ drain and the $n^+$ source and the length of the thin region is the channel length. The $n^-$ region between the $n^+$ source and the $p^+$ region is not involved in controlling the current. In addition, because the depletion layer expands from the drain side into the channel at a blocking time, the channel length must be extended to prevent the depletion layer from reaching the source in order to ensure a withstand voltage. An attempt to ensure a predetermined withstand voltage in this way results in an excessive increase in the on-resistance.

It is an object of the present invention to provide a structure that can attain a lower on-resistance and a better blocking effect.

The present invention provides a structure, for use in a lateral channel type SIT, in which the $p^+$ gate and the $n^+$ source are contiguous. That is, in a lateral channel type SIT, the $p^+$ gate and the $n^+$ source are contiguous. In addition, in a lateral channel type SIT in which a semiconductor body is used as the $p^+$ gate and the gate electrode is formed on the bottom of the semiconductor body, an insulating film is formed on the surface of the $n^-$ channel, an auxiliary gate electrode is formed on the insulating film, and the auxiliary gate electrode and the source electrode are shorted.

In addition, for use in a lateral channel type SIT in which the semiconductor body is used as the $p^+$ gate and the gate electrode is formed on the bottom of the semiconductor body, the present invention provides a structure in which an insulating film is formed on the surface of the $n^-$ channel and an auxiliary gate electrode is formed on the insulating film and the auxiliary gate electrode and the source electrode are shorted.

Connecting the $n^+$ source not via the $n^-$ region but directly to the $p^+$ gate allows the electron current to flow from the source directly into the channel not via a high-resistant layer ($n^-$) that is the cause of an increase in on-resistance. This prevents the on-resistance from increasing. Although voltage withstanding is a problem with a pn junction between high-density regions, the present invention provides a structure for use in a normally-off type SIT in which an off-state exists even when there is no gate-source reverse bias current. Thus, there is no problem because this type of transistor does not require a high gate withstand voltage.

In addition, because the insulating film and the auxiliary gate electrode are formed on the channel and the auxiliary gate electrode and the source electrode are shorted, the potential on the channel is fixed. The fixed potential prevents the depletion layer from being expanded from the drain at blocking time. This makes it possible to shorten the channel length, increases blocking performance, and attains low on-resistance.

Other objects, features and advantages of the invention will become apparent from the following description of the embodiments of the invention taken in conjunction with the accompanying drawings.

DESCRIPTION OF THE EMBODIMENTS

Figure 1:
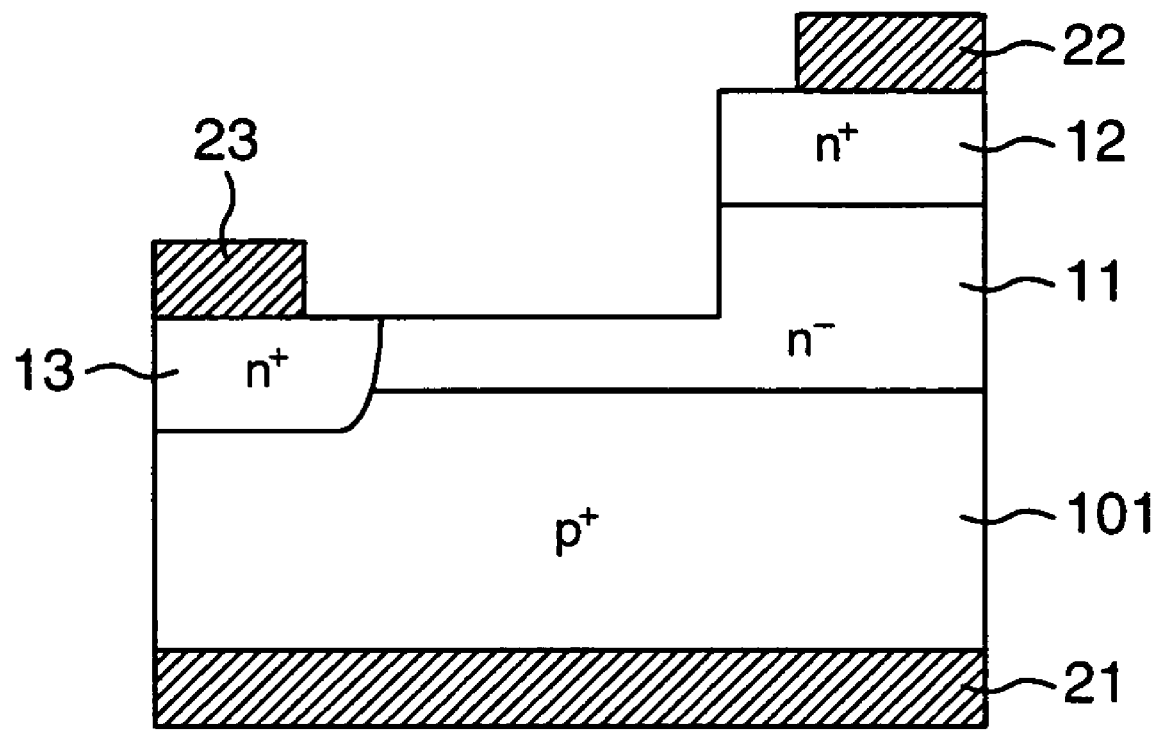
FIG. 1 is a schematic cross sectional diagram showing a first embodiment of the present invention.

One of the embodiments of the present invention is as follows. A semiconductor device, with a band gap of 2.0 eV or higher, has a pair of major surfaces and uses a substrate having a low impurity-density first conductivity type. The semiconductor comprises a first region formed on a first major surface of the substrate and having a second conductivity type and a resistance lower than that of the substrate; a control electrode formed under the first region; and a second region formed on a second major surface of the substrate and having the same conductivity type as, and a resistance lower than, that of the substrate. The semiconductor further comprises a second electrode formed on the second region; a third region formed on the second major surface of the substrate and having the same conductivity type as, and a resistance lower than, that of the substrate; and a third electrode formed on the third region.

The surface of the third region is at a level lower than, a bottom of the second region, and the third region is contiguous to a first region. The semiconductor material used for the semiconductor according to the present invention is silicon carbide, gallium nitride, and so on, with the band gap of 2.0 eV or higher. In another embodiment of the semiconductor device, the second region is formed such that it is exposed on a part of the second major surface.

In still another embodiment of the semiconductor device, the third region is formed on a substrate region lowered from the bottom of the second region by removing the second major surface of the substrate in a part except the second region. In still another embodiment of the semiconductor device, a fourth electrode is formed via an insulating film on a surface of the lowered substrate and on a surface of the third region, and the third electrode and the fourth electrode are shorted. In another embodiment of the semiconductor device, an insulating film is formed on a surface of the lowered substrate, a fourth electrode is formed across the insulating film, and the fourth electrode and the third electrode are shorted. The insulation film made of $SiO_2$ is used to protect/stabilize (passivation) the junction exposed-surface of the semiconductor device or it is used as the film between the electrode and the channel to configure a MOS structure.

In still another embodiment, a silicon carbide semiconductor substrate having a low impurity-density first conductivity type is used. A semiconductor device comprises a first region formed on a first major surface of the substrate and having a second conductivity type and a resistance lower than that of the substrate; a control electrode formed on the first region; and a second region formed on a second major surface of the substrate and having the same conductivity type as, and a resistance lower than, that of the substrate. The semiconductor device further comprises a second electrode formed on the second region; a third region formed on the second major surface of the substrate and having the same conductivity type as, and a resistance lower than, that of the substrate; and a third electrode formed on the third region.

The third region is formed in a region formed by removing a substrate region except the second region, a surface of the third region is at a level lower than a bottom of the second region, and the third region is contiguous to a first region. The second region is formed such that it is exposed on a part of the second major surface.

In another embodiment, the second region is formed in the configuration described above such that the second region is exposed on a part of the second major surface, a fourth electrode is formed via an insulating film on a surface of the lowered substrate and on a surface of said third region, and the third electrode and the fourth electrode are shorted.

The present invention will be described below more in detail using some embodiments. FIG. 1 is a diagram showing a first embodiment of the present invention and shows the cross sectional structure of a lateral channel type SIT. Referring to the figure, the numeral 101 indicates a $p^+$ semiconductor body that is the gate region, the numeral 11 indicates an $n^-$ drift region, the numeral 12 indicates an $n^+$ drain region, and the numeral 13 indicates an $n^+$ source region. The numeral 21 indicates a gate electrode 21, the numeral 22 indicates a drain electrode, and the numeral 23 indicates a source electrode. In this embodiment, p-type 4H-SiC semiconductor body is used as the $p^+$ gate region semiconductor body 101. An n epitaxial layer, 1.0 μm in thickness and $2.0 \times 10^{17}$ cm$^{-3}$ in density, is used as the drift region 11.

Figure 2A:
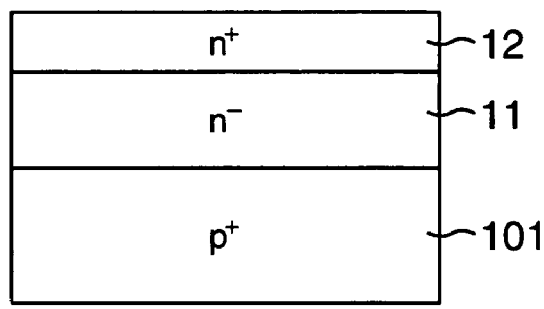
FIGS. 2A-2C are diagrams showing the fabrication process flow of the major parts of the semiconductor device in the first embodiment of the present invention.
Figure 2B:
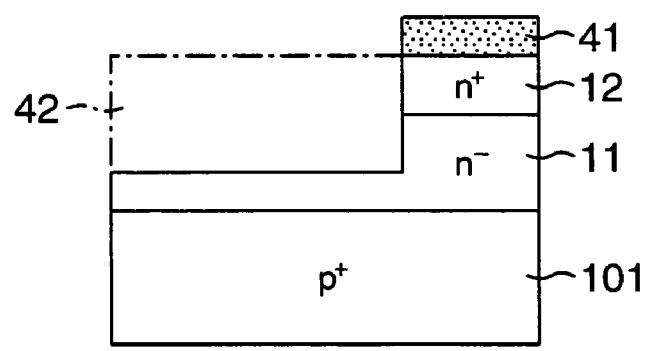
Figure 2C:
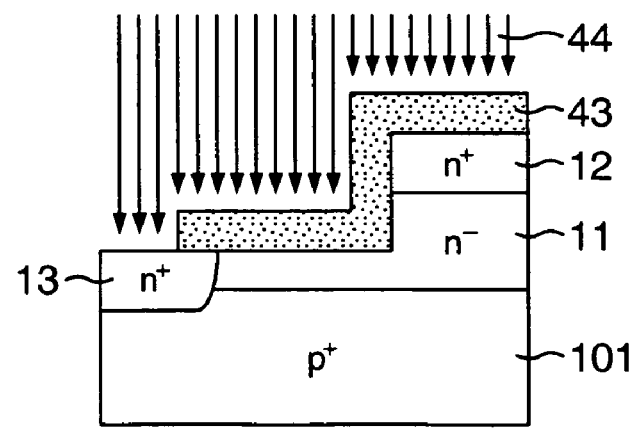

FIGS. 2A-2C are diagrams showing the fabrication process of the structure in this embodiment. As shown in FIG. 2A, the high-density $n^+$ drain region 12 is epitaxially grown on the $n^-$ drift region 11. The dopant is nitrogen that is $1 \times 10^{20}$ cm$^{-3}$ in density. Next, as shown in FIG. 2B, a pattern is formed on a masking material 41 of $SiO_2$ by the photolithography technology and a region 42 corresponding to the channel and the source is removed through dry etching to form a channel that is 0.3 μm in thickness. This reduces the thickness of a part of the $n^-$ drift region 11. The top surface of the region is made lower than the bottom of the $n^+$ drain region 12, that is a boundary surface where the $n^+$ drain region 12 abuts the $n^-$ drift region 11.

Next, a pattern is formed on a masking material 43 of $SiO_2$ by the photolithography technology as shown in FIG. 2C, and a nitrogen ion beam 44 is directed through ion implantation to form the $n^+$ source region 13 such that it is contiguous to the gate region 101. After that, an electrode pattern is formed in the $n^+$ source region 13 to form the structure shown in FIG. 1. The channel is 0.5 μm long.

Connecting the $n^+$ source region 13 not via the $n^-$ drift region 11 but directly to the $p^+$ gate region 101 as in this embodiment allows the electron current to flow from the source directly into the channel not via a high-resistant layer that is the cause of an increase in on-resistance. This attains the withstand voltage of 140V and the on-resistance of 0.5 mΩ·cm$^2$.

Figure 3:
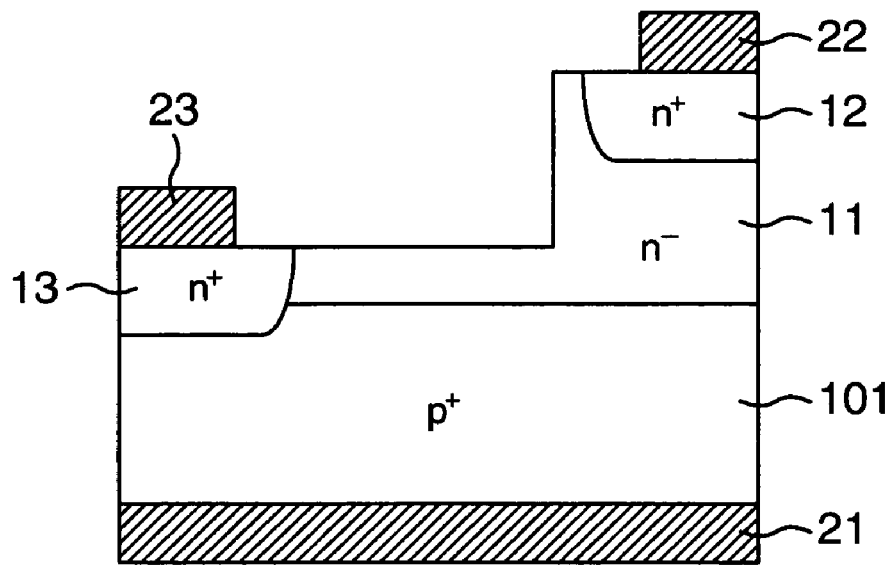
FIG. 3 is a schematic cross sectional diagram showing a second embodiment of the present invention.

FIG. 3 is a diagram showing a second embodiment of the present invention and shows the cross sectional structure of a lateral type SIT. In this embodiment, ion implantation is used to form an $n^+$ drain region 12. Like reference numerals in FIG. 1 are used to indicate like structural parts. This structure differs from that in FIG. 1 in that an $n^+$ drain region 12 is formed on an $n^-$ drift region 11 through ion implantation. The junction end of the drain region 12 is exposed on the second major surface of the substrate that is an $n^-$ drift region 11.

Figure 5A:
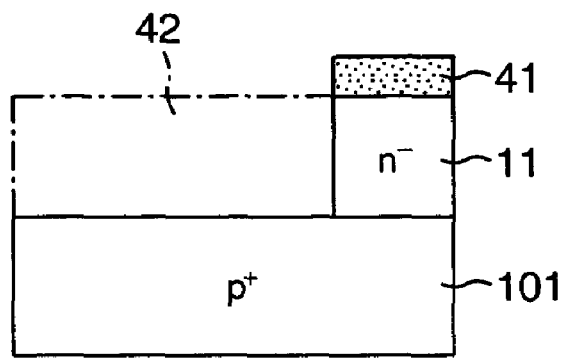
FIGS. 5A-5C are diagrams showing the fabrication process flow of the major parts of the semiconductor device in the second embodiment of the present invention.
Figure 5B:
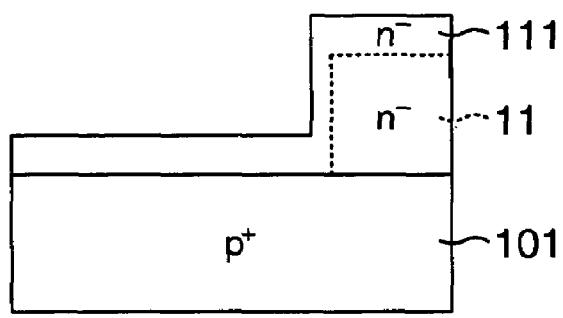
Figure 5C:
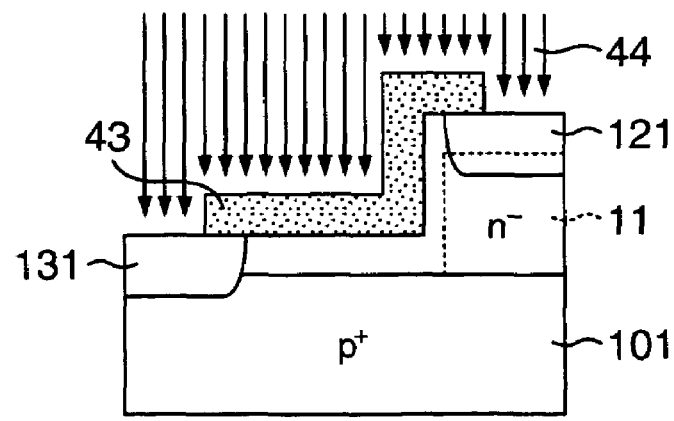

FIGS. 5A-5C are diagrams showing the fabrication process of the second embodiment. After the $n^-$ drift region 11, 0.7 μm in thickness and $2.0 \times 10^{17}$ cm$^{-3}$ in density, is epitaxially grown on a $p^+$ semiconductor body that is a gate region 101, a pattern is formed on a masking material 41 of $SiO_2$ by the photolithography technology as shown in FIG. 5A and then a region 42 corresponding to the channel and the source is removed. Next, as shown in FIG. 5B, an $n^-$ channel layer 111, 0.3 μm in thickness and $2.0 \times 10^{17}$ cm$^{-3}$ in density, is epitaxially grown.

After that, as shown in FIG. 5C, a pattern is formed on a masking material 43 of $SiO_2$ by the photolithography technology, and an $n^+$ source region 131 is formed through ion implantation such that it is contiguous to the $p^+$ semiconductor body that is the gate region 101.

Then, an electrode pattern is formed on the $n^+$ source region 131 to form the structure shown in FIG. 3. The channel is 0.5 μm long. As in the first embodiment, the withstand voltage of 140V and the on-resistance of 0.5 mΩ·cm$^2$ are attained in this embodiment.

In this embodiment, a predetermined part of the $n^-$ drift region 11 is once removed in its entirety in order to control the channel thickness precisely. Because the conductivity of the n⁻ drift region 11 differs from that of the p⁺ semiconductor body 101 in the second embodiment, the end point may be determined easily.

Then, an n⁻ channel layer 111 is ground by an epitaxial growth. The ability to precisely control the thickness of the epitaxial growth of the n⁻ channel layer 111 makes it easy to control the thickness in the channel layer and to prevent a variation in the characteristics. Referring to FIG. 3 showing the second embodiment, a part of the junction end of the n⁺ drain region 12 is exposed on the second major surface of the drift region 11.

Figure 4:
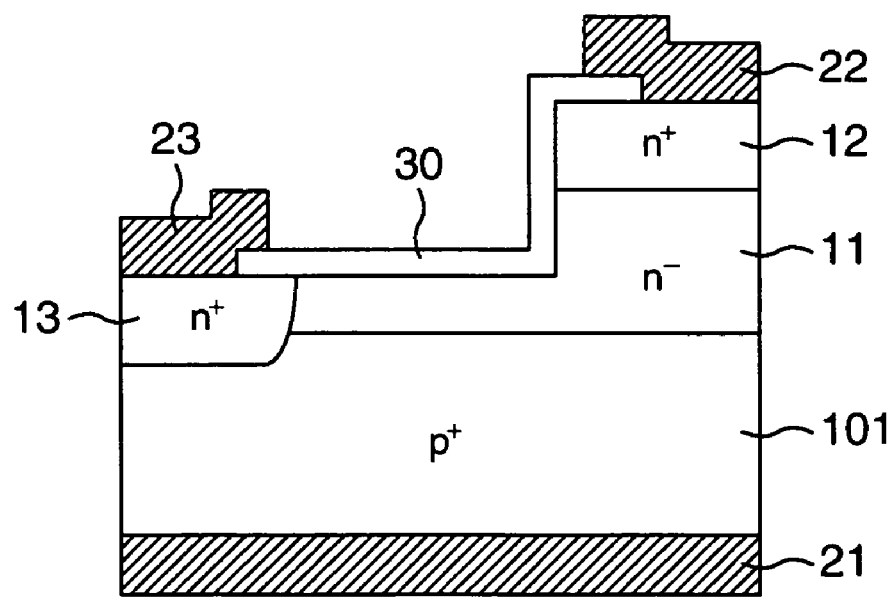
FIG. 4 is a schematic cross sectional diagram showing a third embodiment of the present invention.

FIG. 4 is a diagram showing a third embodiment of the present invention and shows the cross sectional structure of a lateral type SIT. Like reference numerals in FIGS. 1 and 3 are used to indicate like structural parts. This structure differs from those in FIGS. 1 and 3 in that an $SiO_2$ oxide film 30 is formed on the surface and end of an n⁺ drain region 12, on the side of an n⁻ drift region 11, on the surface of the channel, and on the surface of an n⁺ source region 13. This film protects the exposed surface of the regions. In this embodiment, the withstand voltage of 140V and the on-resistance of 0.5 $mΩ·cm^2$ may be attained as in the first embodiment. This prevents deterioration in the characteristics with age.

Figure 6:
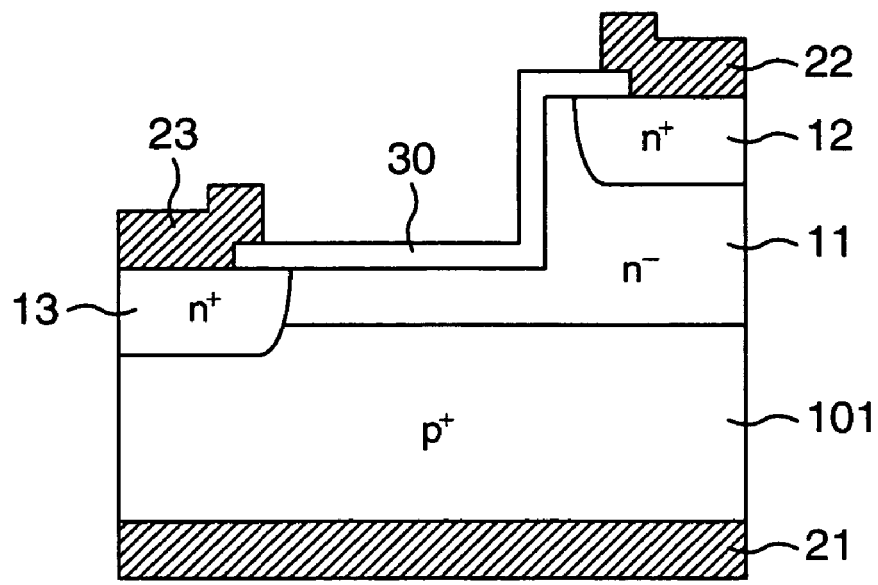
FIG. 6 is a schematic cross sectional diagram showing a fourth embodiment of the present invention.

FIG. 6 is a diagram showing a fourth embodiment of the present invention and shows the cross sectional structure of a lateral type SIT. Like reference numerals in FIG. 3 are used to indicate like structural parts. The structure of this embodiment is similar to that of the second embodiment except that an $SiO_2$ oxide film 30 is formed to protect the top of the drift region 11 and the n⁺ drain region 12 as in the third embodiment.

In this embodiment, a drain electrode 22 is provided inside of an n⁺ drain 12, that is inside of a boundary between the n⁺ drain region 12 and the drift region 11, the n⁺ drain region 12 being exposed to the second main surface of the drift region 11. That is, the drain electrode 22 is formed such that it does not overlap with the junction end of the n⁺ drain region 12. As in the first embodiment, the withstand voltage of 140V and the on-resistance of 0.5 $mΩ·cm^2$ may be attained also in this embodiment. This prevents deterioration in the characteristics with age.

Figure 7:
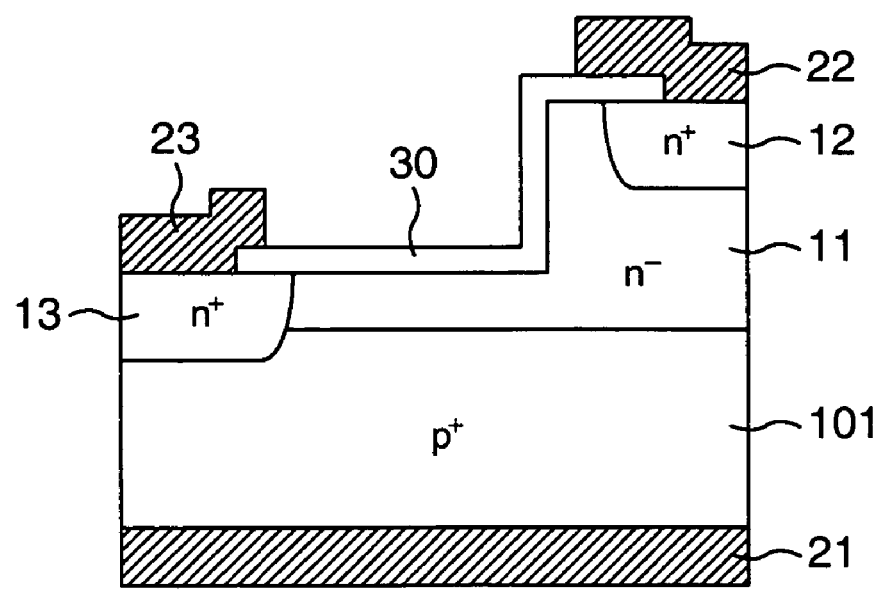
FIG. 7 is a schematic cross sectional diagram showing a fifth embodiment of the present invention.

FIG. 7 is a diagram showing a fifth embodiment of the present invention and shows the cross sectional structure of a lateral type SIT. Like reference numerals in FIG. 6 are used to indicate like structural parts. This embodiment is similar to the fourth embodiment except that, to reduce the electric field intensity around an n⁺ drain region 12, a drain electrode 22 extends beyond the n⁺ drain region 12, that is a boundary between the n⁺ drain region 12 and the drift region 11, to give the field plate effect. This not only gives the characteristics similar to those of the first embodiment but also stabilizes the characteristics.

Figure 8:
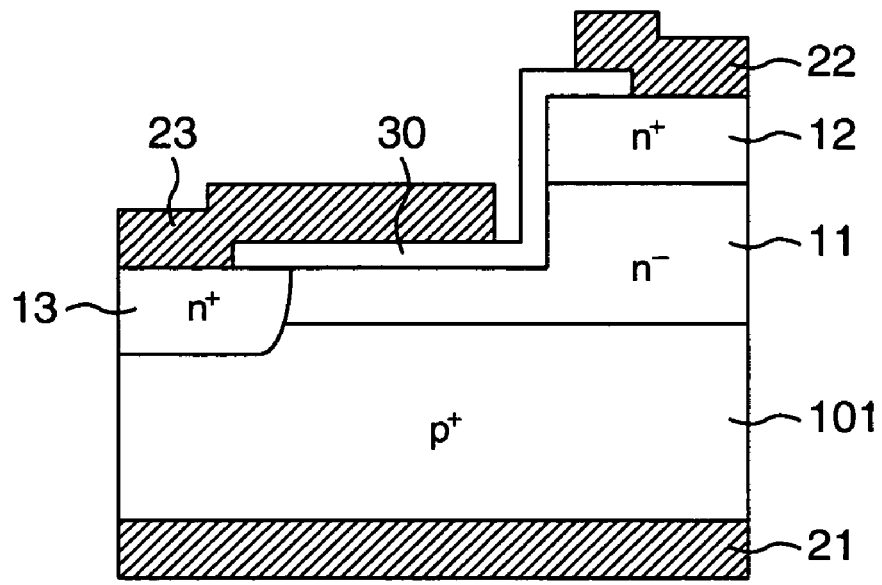
FIG. 8 is a schematic cross sectional diagram showing a sixth embodiment of the present invention.

FIG. 8 is a diagram showing a sixth embodiment of the present invention and shows the cross sectional structure of a lateral type SIT. Like reference numerals in FIG. 4 are used to indicate like structural parts. This embodiment is similar to the third embodiment except that a source electrode 23 extends into the direction of the channel such that the source electrode covers an $SiO_2$ film 30 on the top of the channel. The electrode above the channel, functionally similar to a gate electrode in the MOS structure, produces the effect of channel depletion. That is, the electrode works with the depletion layer, extended from a gate region p⁺ semiconductor body 101, to improve the SIT blocking characteristics.

In addition, because the electric potential on the top of the channel is fixed, the expansion of the electric field into the channel may be blocked even in the blocking state. As a result, the channel may be shortened. According to this embodiment, the channel length may be shortened by 30%, a withstand voltage of 140V may be attained for the channel length of 0.35 μm with the voltage of the gate electrode 21 at 0V, and the on-resistance may be reduced to 0.4 $mΩ·cm^2$.

Figure 9:
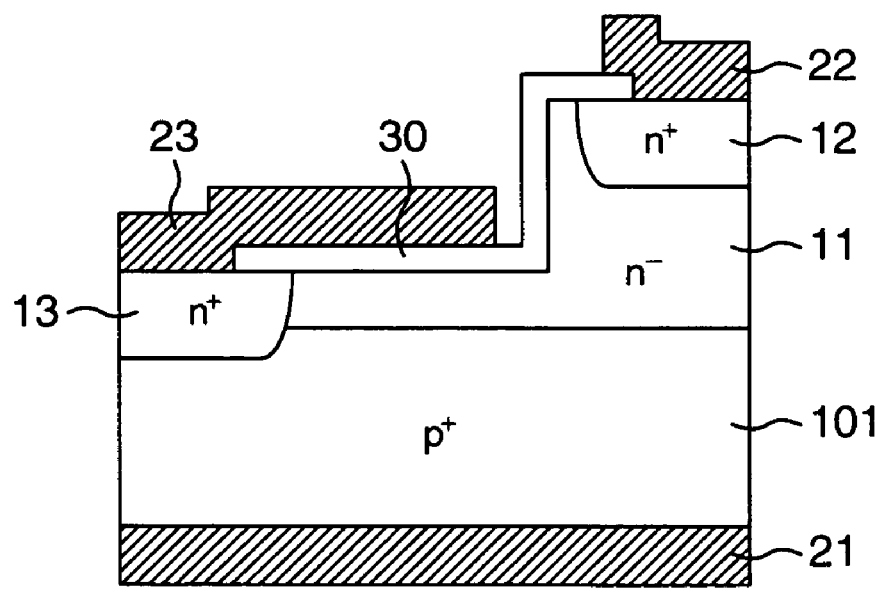
FIG. 9 is a schematic cross sectional diagram showing a seventh embodiment of the present invention.
Figure 11:
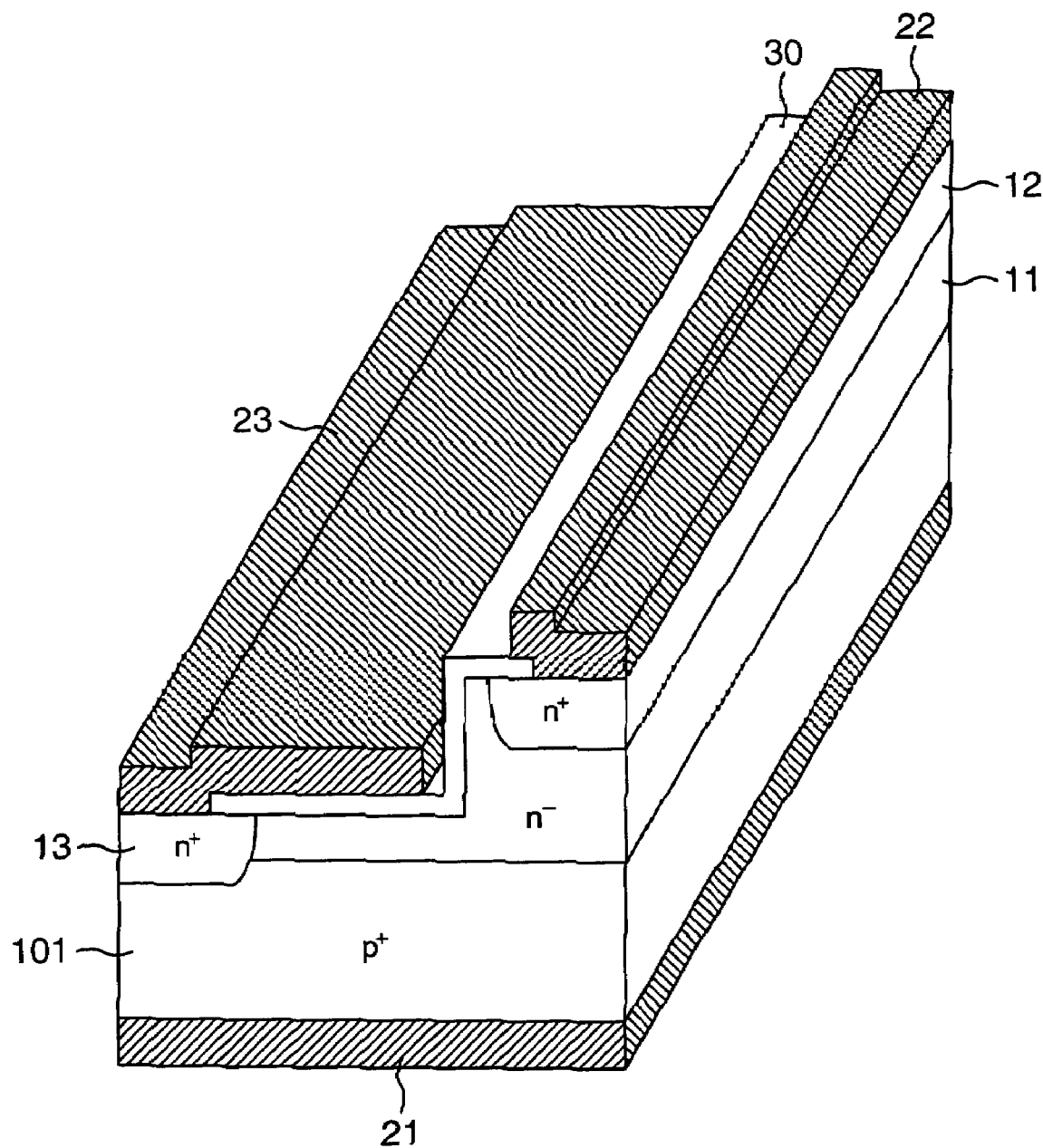
FIG. 11 is a perspective view of the semiconductor device in the seventh embodiment of the present invention.

FIG. 9 is a diagram showing a seventh embodiment of the present invention and shows the cross sectional structure of a lateral type SIT. FIG. 11 is a perspective view of the semiconductor shown in FIG. 9. Like reference numerals in FIG. 9 are used to indicate like structural parts. In this embodiment, the depth is the long side. The top structure of the channel, integrated with the source electrode 23, increases the blocking effect in the off state. Therefore, it is desirable that this structure be formed across the channel width (depth direction) as in this embodiment.

Figure 10A:
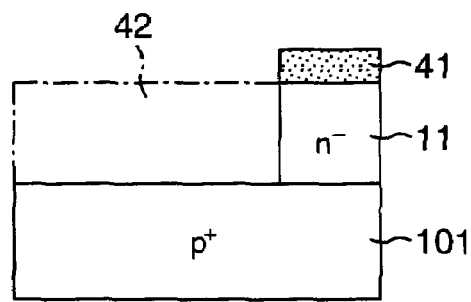
FIGS. 10A-10F are diagrams showing the fabrication process flow of the major parts of the semiconductor device in the seventh embodiment of the present invention.
Figure 10D:
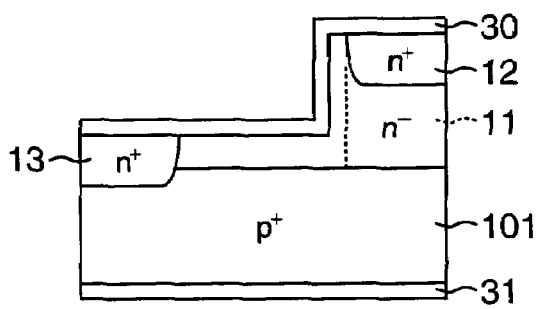
Figure 10B:
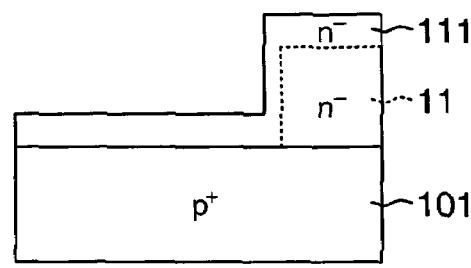

Like reference numerals in FIG. 6 are used to indicate like structural parts. This embodiment is similar to the fourth embodiment except that a source electrode 23 extends into the direction of the channel such that the source electrode covers an $SiO_2$ film 30 on the top of the channel. FIGS. 10A-10F show the formation process of this structure. As shown in FIG. 10A, a region 42 corresponding to the channel and the source is removed after an n⁻ drift region 11 is epitaxially grown as in the second embodiment and then a channel layer 111 is epitaxially grown as shown in FIG. 10B.

Figure 10E:
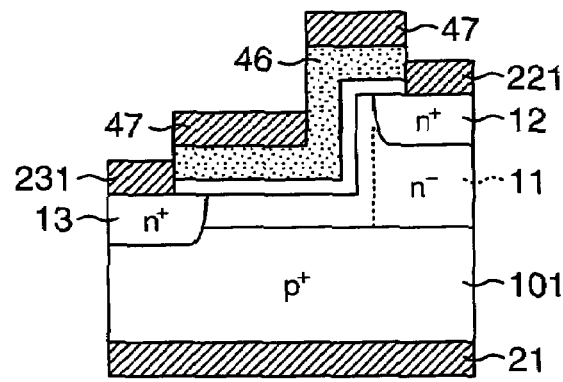
Figure 10C:
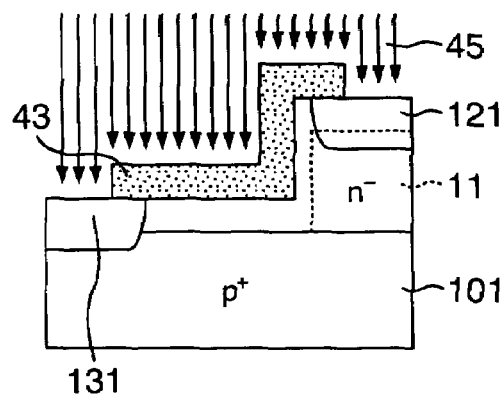

Next, a region 121 corresponding to the drain and a region 131 corresponding to the source are selectively formed through ion implantation as shown in FIG. 10C. After fault-recovery/activation-anneal processing, $SiO_2$ films 30 and 31 are formed through thermal oxidization as shown in FIG. 10D. Then, a contact window is formed on the top of an n⁺ drain region 12 and on the top of an n⁺ source region 13 and, after evaporating a metal electrode such as an Ni electrode, an electrode 47 on the top of a resist 46 is removed by the lift-off method.

Figure 10F:
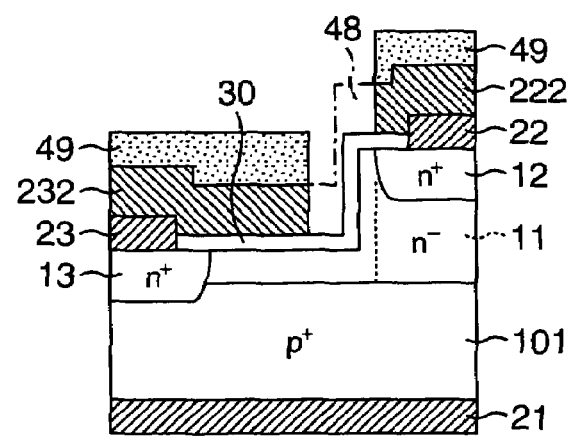

After that, alloy thermal treatment is done, and an alloy drain electrode 221 alloyed with the n⁺ drain region 12 and an alloy source electrode 231 alloyed with the n⁺ source region 13 are formed as shown in FIG. 10E. Finally, metal such as Al is evaporated all over the surface and an unnecessary region 48 between the channel and the drain is removed as shown in FIG. 10F to produce the structure in this embodiment shown in FIG. 9.

As in the sixth embodiment, the withstand voltage of 140V may be attained for the channel length of 0.35 μm with the voltage of the gate electrode 21 at 0V and, in addition, the on-resistance may be reduced to 0.4 $mΩ·cm^2$. Epitaxial growth used to form the channel allows the channel thickness to be controlled precisely, minimizes a variation in the characteristics, and increases the yield rate.

The semiconductor device according to the present invention, if used as the switching device of an inverter, makes the gate drive operation easy and, at the same time, reduces the loss because of a better blocking effect and a low on-resistance.

It should be further understood by those skilled in the art that although the foregoing description has been made on embodiments of the invention, the invention is not limited thereto and various changes and modifications may be made without departing from the spirit of the invention and the scope of the appended claims.

What is claimed is:

1. A semiconductor device, comprising:
   a silicon carbide semiconductor substrate having a low impurity-density first conductivity type;
   a first region formed on a first major surface of said substrate and having a second conductivity type and a resistance lower than that of said substrate;
   a control electrode formed under said first region;
   a second region formed on a second major surface of said substrate and having the same conductivity type as, and a resistance lower than, that of said substrate;
   a second electrode formed on said second region;
   a third region formed on the second major surface of said substrate and having the same conductivity type as, and a resistance lower than, that of the substrate; and
   a third electrode formed on said third region,
   wherein said third region is formed in a region formed by removing a substrate region except said second region, a surface of said third region is at a level lower than a bottom of said second region, said third region is contiguous to a first region, and said second region is formed such that it is exposed on a part of said second major surface.

2. A semiconductor device, comprising:
   a silicon carbide semiconductor substrate having a low impurity-density first conductivity type;
   a first region formed on a first major surface of said substrate and having a second conductivity type and a resistance lower than that of said substrate;
   a control electrode formed under said first region;
   a second region formed on a second major surface of said substrate and having the same conductivity type as, and a resistance lower than, that of said substrate;
   a second electrode formed on said second region;
   a third region formed on the second major surface of said substrate and having the same conductivity type as, and a resistance lower than, that of the substrate;
   a third electrode formed on said third region,
   wherein said third region is formed in a region formed by removing a substrate region except said second region, a surface of said third region is at a level lower than a bottom of said second region, said third region is contiguous to a first region, and said second region is formed such that it is exposed on a part of said second major surface; and
   wherein a fourth electrode is formed via an insulating film on a surface of the lowered substrate and on a surface of said third region and wherein the third electrode and the fourth electrode are shorted.

3. A semiconductor device, comprising:
   a silicon carbide semiconductor substrate having a low impurity-density first conductivity type;
   a first region formed on a first major surface of said substrate and having a second conductivity type and a resistance lower than that of said substrate;
   a control electrode formed under said first region;
   a second region formed on a second major surface of said substrate and having the same conductivity type as and a resistance lower than, that of said substrate;
   a second electrode formed on said second region;
   a third region formed on the second major surface of said substrate and having the same conductivity type as and a resistance lower than, that of the substrate;
   a third electrode formed on said third region,
   wherein said third region is formed in a region formed by removing a substrate region except said second region, a surface of said third region is at a level lower than a bottom of said second region, said third region is contiguous to a first region, and said second region is formed such that it is exposed on a part of said second major surface; and
   wherein an insulating film is formed on a surface of the lowered substrate, a fourth electrode is formed across the insulating film, and said fourth electrode and said third electrode are shorted.

* * * * *